United States Patent
Watkins

(10) Patent No.: US 8,633,500 B2
(45) Date of Patent: Jan. 21, 2014

(54) LIGHT EMITTING DIODES AND METHODS FOR MANUFACTURING LIGHT EMITTING DIODES

(75) Inventor: Charles M. Watkins, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/607,316

(22) Filed: Sep. 7, 2012

(65) Prior Publication Data

US 2013/0001590 A1 Jan. 3, 2013

Related U.S. Application Data

(62) Division of application No. 12/728,080, filed on Mar. 19, 2010, now Pat. No. 8,273,589.

(51) Int. Cl.
*H01L 29/20* (2006.01)

(52) U.S. Cl.
USPC .............. 257/89; 257/88; 257/E21.366

(58) Field of Classification Search
USPC ............... 257/E21.365, E21.366, E21.398, 257/E21.527
See application file for complete search history.

(56) References Cited

U.S. PATENT DOCUMENTS

| | | | |
|---|---|---|---|
| 6,642,652 B2 | 11/2003 | Collins, III et al. | |
| 6,864,110 B2 | 3/2005 | Summers et al. | |
| 6,869,753 B2 | 3/2005 | Chua et al. | |
| 7,372,198 B2 | 5/2008 | Negley | |
| 7,514,698 B2 | 4/2009 | Isoda | |
| 7,569,407 B2 | 8/2009 | Negley et al. | |
| 2004/0256974 A1 | 12/2004 | Mueller-Mach et al. | |
| 2008/0135860 A1* | 6/2008 | Setlur et al. .................. | 257/98 |
| 2008/0149945 A1 | 6/2008 | Nagai | |
| 2008/0272712 A1 | 11/2008 | Jalink et al. | |
| 2009/0039375 A1 | 2/2009 | LeToquin et al. | |
| 2009/0057701 A1 | 3/2009 | Chao | |
| 2009/0140633 A1 | 6/2009 | Tanimoto et al. | |
| 2009/0179207 A1 | 7/2009 | Chitnis et al. | |
| 2010/0059771 A1 | 3/2010 | Lowery et al. | |
| 2010/0081218 A1 | 4/2010 | Hardin | |
| 2011/0227106 A1 | 9/2011 | Watkins | |

FOREIGN PATENT DOCUMENTS

| | | |
|---|---|---|
| JP | 2009016689 A | 1/2009 |
| KR | 20080001286 A | 1/2008 |

OTHER PUBLICATIONS

Feezell, D.F. et al., Development of Nonpolar and Semipolar InGaN/GaN Visible Light-Emitting Diodes, MRS Bulletin, vol. 34, pp. 318-323, May 2009.

International Search Report and Written Opinion issued Nov. 29, 2011 in International Application No. PCT/US2011/029045, 6 pages.

* cited by examiner

*Primary Examiner* — Cheung Lee
(74) *Attorney, Agent, or Firm* — Perkins Coie LLP

(57) ABSTRACT

Light emitting diodes and methods for manufacturing light emitting diodes are disclosed herein. In one embodiment, a method for manufacturing a light emitting diode (LED) comprises applying a first light conversion material to a first region on the LED and applying a second light conversion material to a second, different region on the LED. A portion of the LED is exposed after applying the first and second light conversion materials.

21 Claims, 7 Drawing Sheets

LIGHT EMITTING DIODES AND METHODS FOR MANUFACTURING LIGHT EMITTING DIODES

CROSS-REFERENCE TO RELATED APPLICATION

This application is a divisional of U.S. application Ser. No. 12/728,080 filed Mar. 19, 2010, now U.S. Pat. No. 8,273,589, which is incorporated herein by reference in its entirety.

TECHNICAL FIELD

The present disclosure is directed generally to light emitting diodes and methods for manufacturing light emitting diodes.

BACKGROUND

Light emitting diodes (LEDs) are an efficient source of bright light for computer monitors, televisions, cellphones, digital cameras, and a variety of other electronic devices and applications. White light LEDs can also be used in general lighting, architectural, outdoor, commercial, and/or residential illumination. True white light LEDs, however, are not available because LEDs typically only emit at one particular wavelength. For human eyes to perceive the color white, a mixture of wavelengths is needed.

One conventional technique for emulating white light with LEDs includes depositing a light conversion material (e.g., a phosphor) on a base material (e.g., indium gallium nitride (InGaN)). In operation, the InGaN base material emits a blue light that stimulates the light conversion material to emit a yellow light. Because yellow light stimulates the red and green receptors of a human eye, the resulting mix of blue and yellow light gives the appearance of white to the eye if the base material and light conversion material are matched appropriately. If not matched appropriately, however, the combined emissions appear off white and may reduce color fidelity of electronic devices.

DETAILED DESCRIPTION

Various embodiments of microelectronic workpieces having LEDs formed thereon and methods for manufacturing such LEDs are described below. The term "microelectronic workpiece" is used throughout to include substrates upon which and/or in which microelectronic devices, micromechanical devices, data storage elements, read/write components, and other features are fabricated. Substrates can be, for example, semiconductive pieces (e.g., silicon wafers, gallium arsenide wafers, or other semiconductor wafers), nonconductive pieces (e.g., various ceramic substrates), or conductive pieces. Well-known structures, systems, and methods often associated with such systems have not been shown or described in detail to avoid unnecessarily obscuring the description of the various embodiments of the technology. A person of ordinary skill in the relevant art will accordingly understand that the technology may have additional embodiments and that the technology may be practiced without several of the elements shown and described below with reference to FIGS. 1A-8.

Figure 1A:
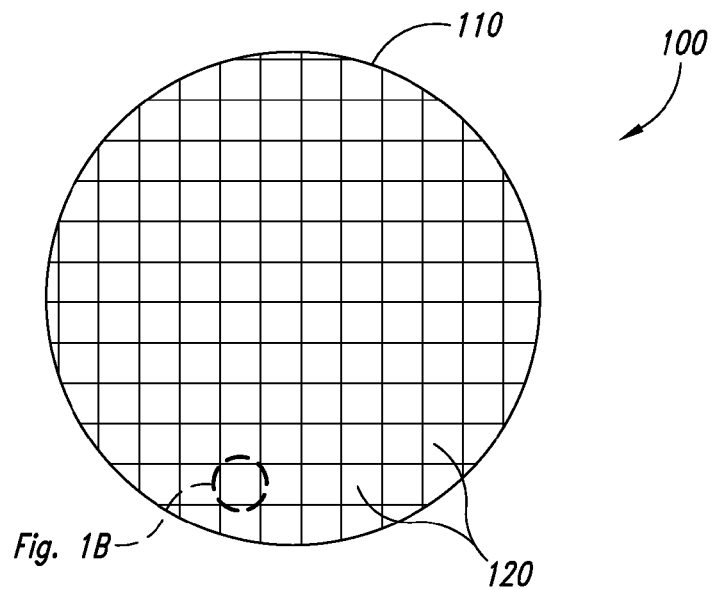
FIG. 1A is a partially schematic illustration of a representative microelectronic workpiece carrying microelectronic devices configured in accordance with embodiments of the technology.
Figure 1B:
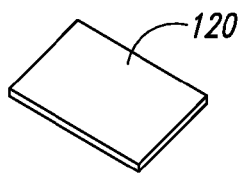
FIG. 1B is a schematic illustration of a microelectronic device singulated from the workpiece shown in FIG. 1A.

FIG. 1A is a microelectronic workpiece 100 in the form of a semiconductor wafer 110 that includes multiple microelectronic devices or components 120. At least some of the processes described below may be conducted on the microelectronic workpiece 100 at the wafer level, and other processes may be conducted on the individual microelectronic devices 120 of the microelectronic workpiece 100 after the devices 120 have been singulated from the larger wafer 110. Accordingly, unless otherwise noted, structures and methods described below in the context of a microelectronic workpiece can apply to the wafer 110, the devices 120 that are formed from the wafer 110, and/or an assembly of one or more devices 120 attached to a support member. FIG. 1B is a schematic illustration of an individual device 120 after it has been singulated from the wafer 110 shown in FIG. 1A. The device 120 can include operable microelectronic structures, optionally encased within a protective encapsulant. For example, the device 120 can include an InGaN and/or other types of LEDs, transistors, capacitors, color filters, mirrors, and/or other types of electrical/mechanical/optical components. The device 120 can be electrically connected to external structural devices by pins, bond pads, solder balls, redistribution structures, and/or other conductive structures.

FIGS. 2A-6 illustrate various stages of a method for selectively applying light conversion materials onto LEDs in accordance with embodiments of the technology. As described in greater detail below, one or more light conversion materials or converter materials (e.g., phosphor) can be applied onto discrete areas of each LED on a workpiece or wafer. The term "phosphor" generally refers to a material that can sustain glowing after exposure to energized particles (e.g., electrons and/or photons). The light conversion material(s) can be patterned or selectively applied onto each LED to help compensate for color variances across the wafer. Further, the color(s) of the individual components on the wafer can be precisely tuned or controlled using the methods described herein.

Figure 2A:
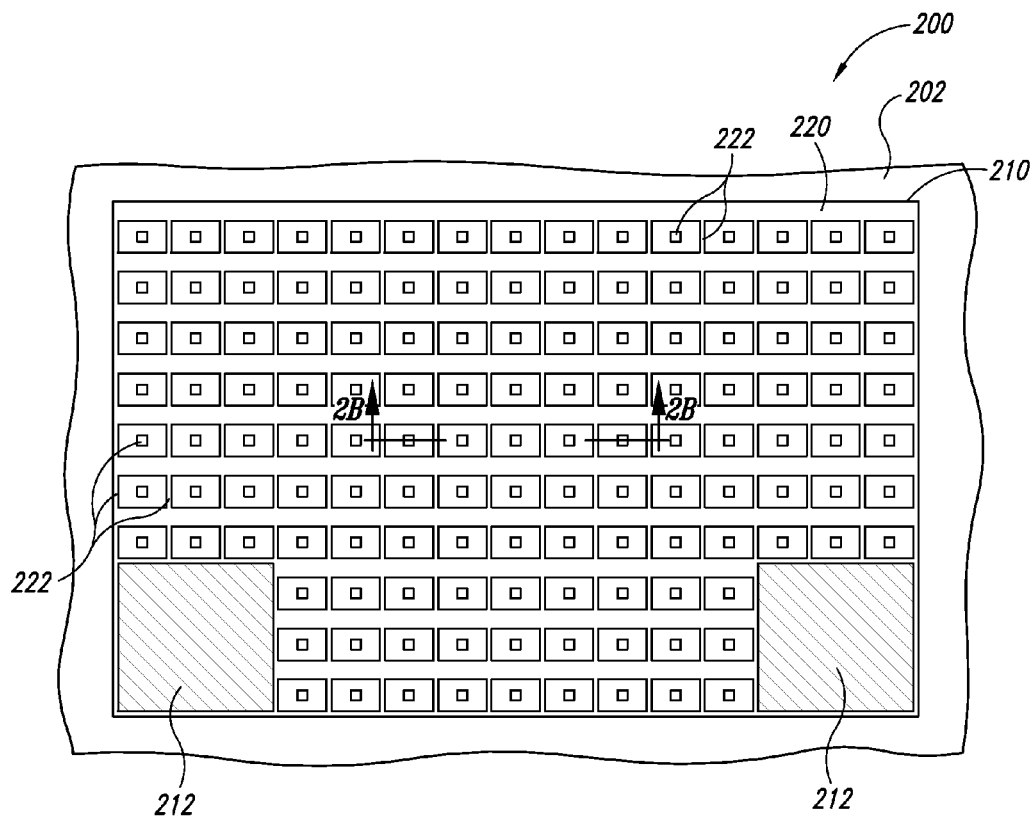
FIGS. 2A-6 illustrate various stages of a method for selectively applying light conversion materials onto LEDs in accordance with embodiments of the technology.
Figure 2B:
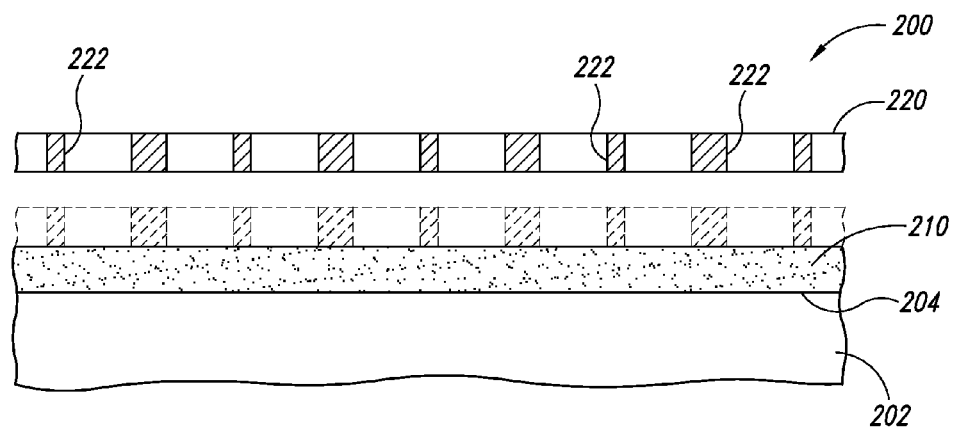

FIG. 2A is a partially schematic, top plan view of a portion of a microelectronic workpiece 200 at an initial processing stage before any light conversion material has been applied onto the workpiece 200. FIG. 2B is a partially schematic, side cross-sectional view taken substantially along line 2B-2B of FIG. 2A. Referring to FIGS. 2A and 2B together, the microelectronic workpiece 200 includes a semiconductor substrate 202 having a front or active side 204 (FIG. 2B) and an LED 210 (e.g., an InGaN LED) formed at the front side 204 (FIG. 2B). Although only a single LED 210 is shown, it will be appreciated that the methods described herein with reference to FIGS. 2A-6 may be performed on multiple devices simultaneously or approximately simultaneously across the workpiece 200.

The workpiece 200 can include several features generally similar to the workpiece 100 described above with reference to FIGS. 1A and 1B. The substrate 202, for example, can be a semiconductor wafer with a plurality of microelectronic devices or components (e.g., LEDs 210) arranged in a die pattern on the wafer. Individual LEDs 210 also include terminals 212 (e.g., bond pads as shown in FIG. 2A) and circuitry (not shown) electrically coupled to the terminals 212. One technique for forming the InGaN LEDs can include sequentially applying N-doped GaN, InGaN, and P-doped GaN materials on a sapphire ($Al_2O_3$) and/or silicon (Si) substrate via epitaxial growth in a metal organic chemical vapor deposition (MOCVD) process. In other embodiments, however, other suitable techniques may be used to form the LED 210.

Light conversion materials can be selectively applied to the LED 210 using a variety of different methods. In the illustrated embodiment, for example, a first mask or reticle 220 is positioned over the LED 210. The first mask 220 includes a plurality of apertures or openings 222 corresponding to a desired pattern for a first light conversion material (not shown—described in detail below with reference to FIGS. 3A and 3B) on the LED 210. The first mask 220 can be a discrete component spaced apart from an upper surface of the LED 210, or the mask 220 may be composed of a photoresist material or other suitable mask material applied on the upper surface of the LED 210 (as shown in broken lines in FIG. 2B) and patterned using photolithography and/or other suitable techniques. The terminals 212 can also be masked off to prevent shorting or contamination during processing.

Figure 3A:
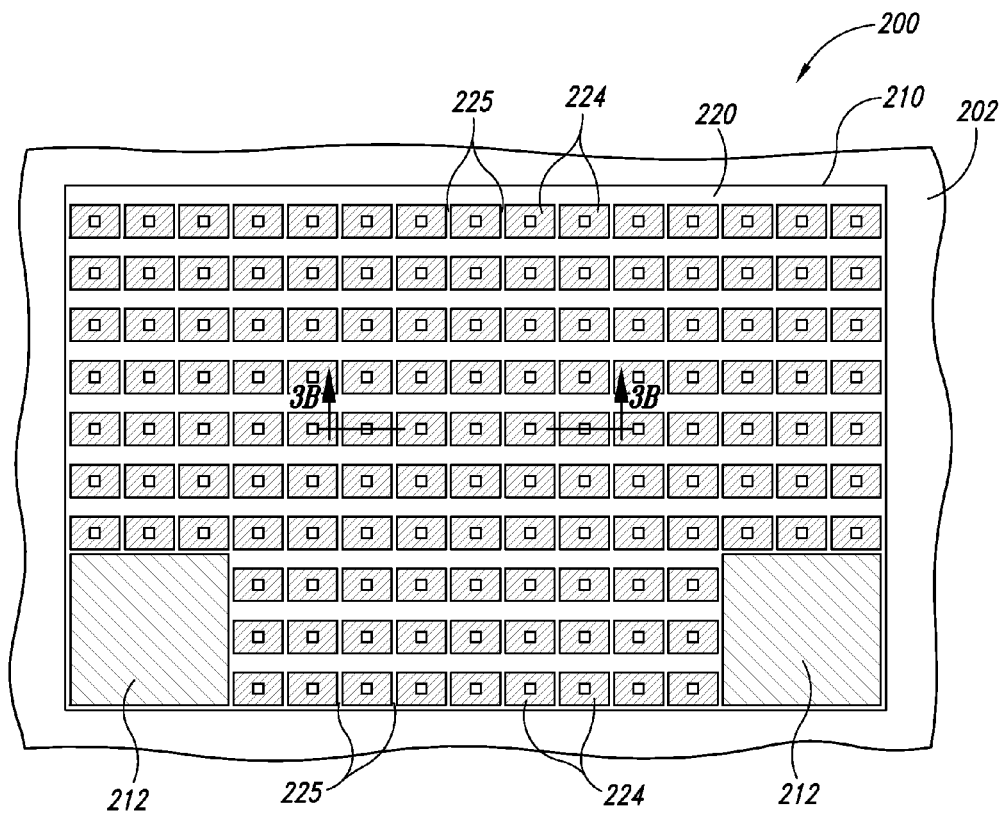
Figure 3B:
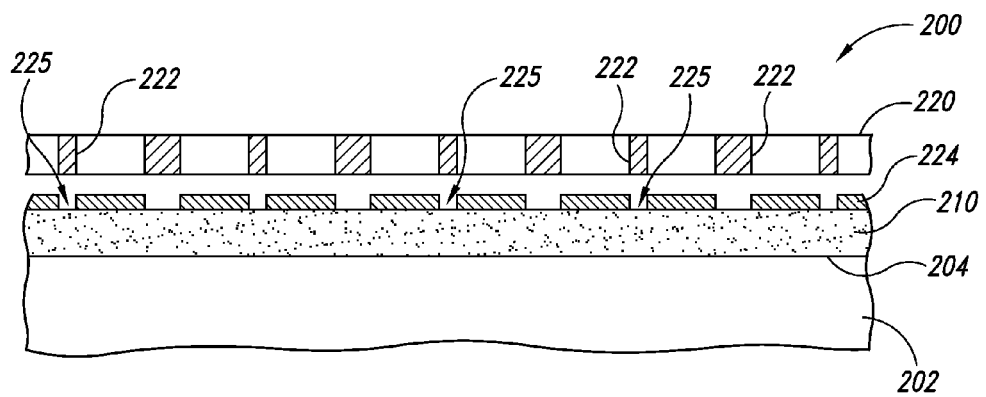

Referring to FIGS. 3A and 3B, a first light conversion material or first converter material 224 (e.g., yellow phosphor) is applied in a desired pattern on the LED 210. The first light conversion material 224 can be applied using a screen printing process and/or other suitable methods. As mentioned above, the first mask 220 is configured to exclude certain contact areas such that the first light conversion material 224 is selectively applied onto only desired regions of the LED 210. In the illustrated embodiment, the first light conversion material 224 comprises a plurality of blocks or "islands" arranged in a selected pattern on the LED 210. The individual portions of the first light conversion material 224 are separated from each other by a plurality of first gaps or channels 225. The pattern shown in FIGS. 3A and 3B is merely representative of one particular pattern for the first light conversion material 224. The first light conversion material 224 can be applied onto the LED 210 in a wide variety of different patterns or arrangements.

The first light conversion material 224 can have a composition that emits at a desired wavelength when stimulated. For example, in one embodiment, the first light conversion material 224 can include a phosphor containing Cerium(III)-doped Yttrium Aluminum Garnet (Ce:YAG or YAG:Ce) at a particular concentration. Such a material can emit a broad range of colors from green to yellow and to red under photoluminescence. In other embodiments, the first light conversion material 224 can include Neodymium-doped YAG, Neodymium-Chromium double-doped YAG, Erbium-doped YAG, Ytterbium-doped YAG, Neodymium-cerium double-doped YAG, Holmium-chromium-thulium triple-doped YAG, Thulium-doped YAG, Chromium(IV)-doped YAG, Dysprosium-doped YAG, Samarium-doped YAG, Terbium-doped YAG, and/or other suitable phosphor compositions. In yet other embodiments, the first light conversion material 224 can include Europium phosphors (e.g., CaS:Eu, $CaAlSiN_3$:Eu, $Sr_2Si_5N_8$:Eu, SrS:Eu, $Ba_2Si_5N_8$:Eu, $Sr_2SiO_4$:Eu, $SrSi_2N_2O_2$:Eu, $SrGa_2S_4$:Eu, $SrAl_2O_4$:Eu, $Ba_2SiO_4$:Eu, $Sr_4All_4O_{25}$:Eu, $SrSiAl_2O_3N$:Eu, $BaMgAl_{10}O_{17}$:Eu, $Sr_2P_2O_7$:Eu, $BaSO_4$:Eu, and/or $SrB_4O_7$:Eu). The foregoing list of light conversion materials is not exhaustive. The phosphor material may also be mixed in a suitable carrier material (epoxy, silicone, etc.).

As mentioned above, the first light conversion material (and any subsequent light conversion materials) can be selectively applied to the LED 210 using a number of different methods. For example, in another suitable method for selectively applying the first light conversion material 224 on the LED 210, a phosphor material (e.g., Ce:YAG) is mixed with a photosensitive material (e.g., PVA and ammonium dichromate) and a layer of the composition is applied onto the LED 210. A photolithographic procedure can be used to selectively expose portions of the composition such that the exposed portions are "fixed" at desired locations on the LED 210 to form the first light conversion material 224. This apply/expose/develop process can be repeated any number of times to selectively apply additional light conversion materials onto the LED 210.

Still another suitable technique for selectively applying the first light conversion material 224 comprises spinning a photoresist material onto the LED 210 and patterning the material to form openings over desired areas or regions of the LED 210. The first light conversion material 224 can be applied into the openings and onto the LED 210 using electrophoresis or another suitable process. After applying the first light conversion material 224, the photoresist can be removed. In an alternative embodiment, rather than using a photosensitive material, some other suitable material may be applied onto the LED 210 and the openings can be selectively formed using excimer laser ablation or another suitable process. In yet other embodiments, other suitable techniques may be used to selectively apply the first light conversion material 224 (and any subsequent light conversion materials) onto the LED 210.

Figure 4A:
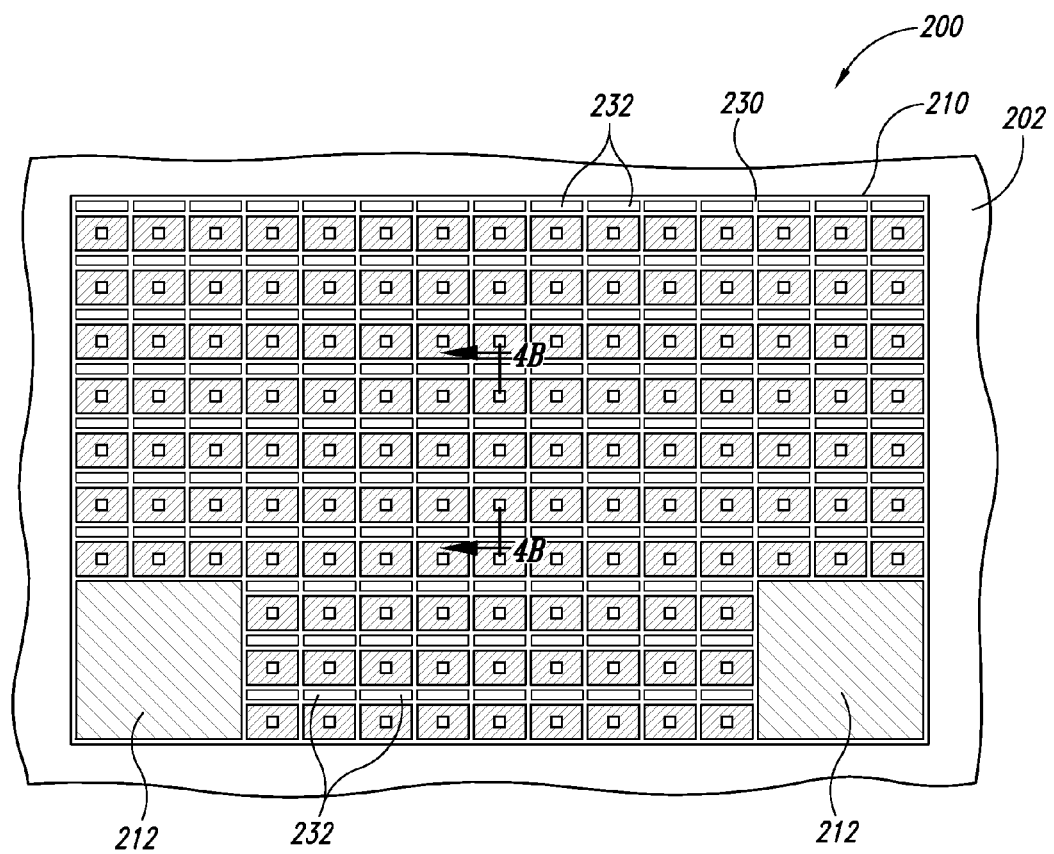
Figure 4B:
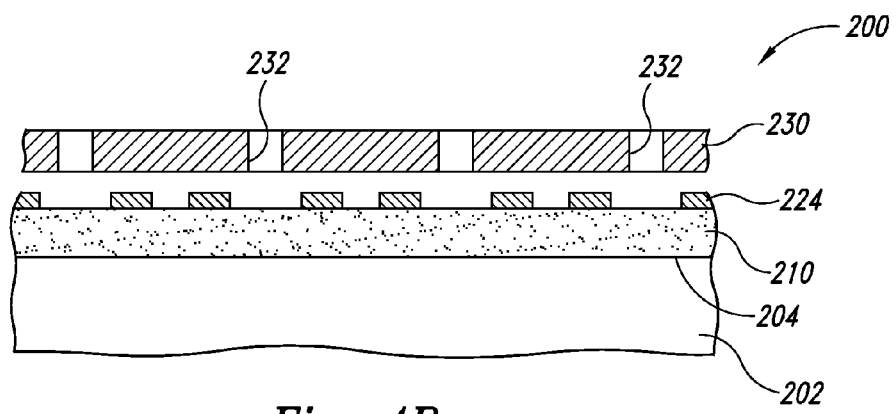

Referring to FIGS. 4A and 4B, a second mask or reticle 230 is positioned over the LED 210. The second mask 230 includes a plurality of apertures or openings 232 corresponding to a desired pattern for a second light conversion material (not shown—described in detail below with reference to FIGS. 5A and 5B) on the LED 210. As with the first mask 220, the second mask 230 can be a discrete component spaced apart from an upper surface of the LED 210, or the second mask 230 may be composed of a photoresist material or other suitable mask material applied on the upper surface of the LED 210 and patterned using photolithography and/or other suitable techniques.

Figure 5A:
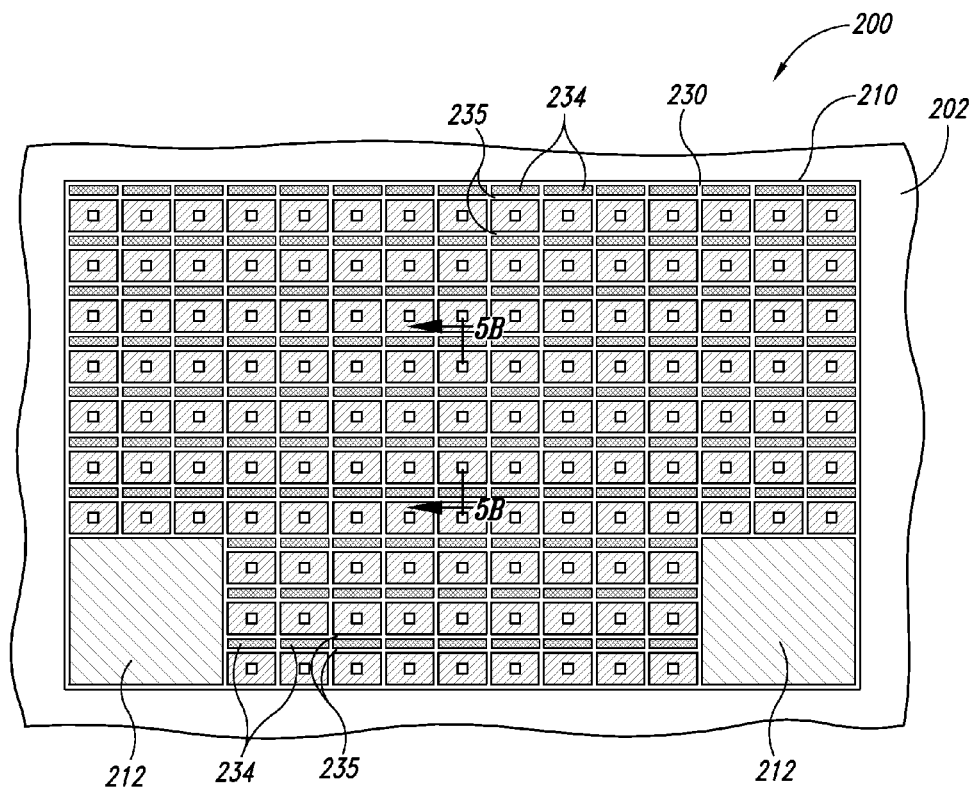
Figure 5B:
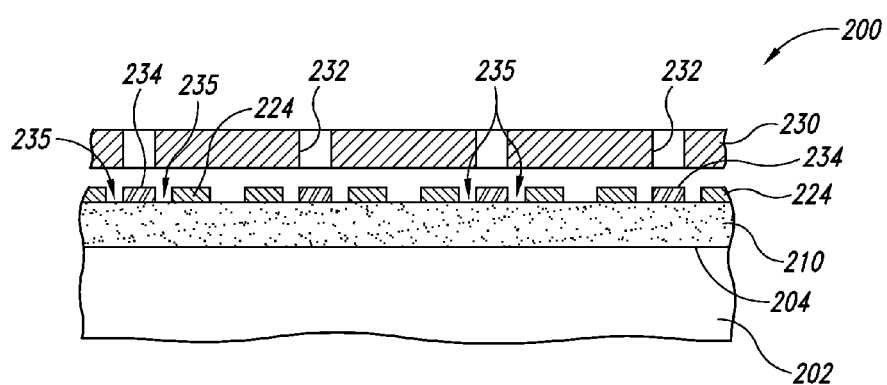

Referring next to FIGS. 5A and 5B, a second light conversion material 234 (e.g., red phosphor) is selectively applied in a desired pattern on the LED 210. In the illustrated embodiment, for example, the second light conversion material 234 comprises a plurality of blocks or "islands" arranged in a selected pattern on the LED 210 in which the second light conversion material 234 may or may not contact adjacent portions of the first light conversion material 224. The individual portions of the second light conversion material 234, for example, can be separated from each other and the first light conversion material 224 by a plurality of second gaps or channels 235. The pattern shown in FIGS. 5A and 5B is merely representative of one particular pattern for the second light conversion material 234. The second light conversion material 234 can be applied onto the LED 210 in a wide variety of different patterns or arrangements.

The second light conversion material 234 can be composed of materials similar to those of the first light conversion material (e.g., Ce:YAG, etc.) described above with reference to FIGS. 3A and 3B. In addition, the second light conversion material 234 may be applied onto the LED 210 using processes similar to those used to apply the first light conversion material 224 described above with reference to FIGS. 3A and 3B. In other embodiments, however, the second light conversional material 234 may be composed of different materials and/or may be applied onto the LED 210 using different techniques.

Figure 6:
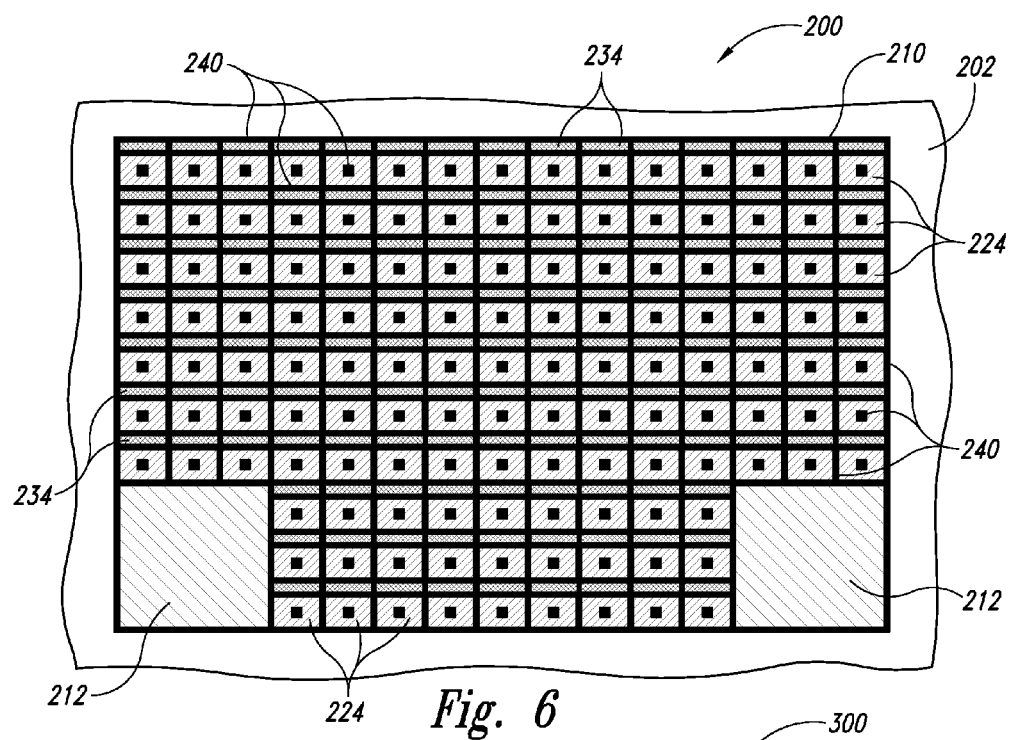

FIG. 6 is a partially schematic, top plan view of the workpiece 200 after the first and second light conversion materials 224 and 234 have been selectively applied on desired portions of the LED 210 and the second mask 230 (FIGS. 5A and 5B) has been removed. The LED 210 includes a plurality of uncoated or uncovered portions 240 that do not contain any light conversion materials and allow blue light to pass through. The LED 210 is accordingly configured to produce a desired color of light based on the arrangement of and contributions from the uncoated portions 240, the portions of first light conversion material 224, and the portions of second light conversion material 234. It will be appreciated that the selection of particular compositions for the first and second light conversion materials 224 and 234 and the precise placement of the first and second light conversion materials 224 and 234 on the LED 210 allow the LED 210 to produce any desired color of light (e.g., white light). Moreover, although only two light conversion materials are described herein, in other embodiments only a single light conversion material or more than two light conversion materials may be applied onto the LED 210.

As mentioned previously, although only a single LED 210 is shown above with reference to FIGS. 2A-6, the methods described herein may be performed simultaneously or approximately simultaneously on multiple LEDs 210 across the workpiece 200. In one embodiment, for example, each LED 210 on the workpiece 200 may be processed using an identical or generally identical pattern of light conversion materials. In other embodiments, however, the pattern of light conversion material(s) on the individual LEDs 210 may vary across the workpiece 200. For example, one challenge of manufacturing microelectronic devices at the wafer level is accounting for variances in the individual microelectronic devices. It has been recognized, for example, that processing variances in epitaxial growth, chemical-mechanical polishing, wet etching, and/or other operations during formation of the microelectronic devices on the same microelectronic workpiece may cause the LEDs in one region of the workpiece 200 to emit light at different wavelengths than another region. As a result, if each LED across the workpiece 200 includes the same pattern of selectively applied light conversion materials, the emission from at least some of the LEDs may be inconsistent or off white (e.g., tinted to red, blue, and/or green). Embodiments of the methods described above with reference to FIGS. 2A-6 can address the foregoing emission variations in the LEDs across the workpiece 200 by specifically tailoring the composition of and/or arrangement of the first and second light conversion materials 224 and 234 for individual LEDs 210.

In other embodiments, however, rather than customizing the pattern for each LED 210, a pattern of selectively applied light conversion materials can be used for multiple LEDs in a particular region on the workpiece 200. For example, an operator may measure the emission characteristics of selected LEDs 210 on the workpiece 200 as representative for a region of individual LEDs 210. In further embodiments, measured emission characteristics may be averaged, filtered, and/or otherwise manipulated to derive a value as representative for a region of the individual LEDs 210. In still other embodiments, workpieces to be processed may be sorted beforehand so that a first batch of workpieces having similar emission characteristics can be processed together using a first selected pattern of light conversion materials for device on the individual workpieces, a second batch of workpieces can be processed together using a second pattern of light conversion materials for devices on the individual workpieces, and so on.

Figure 7:
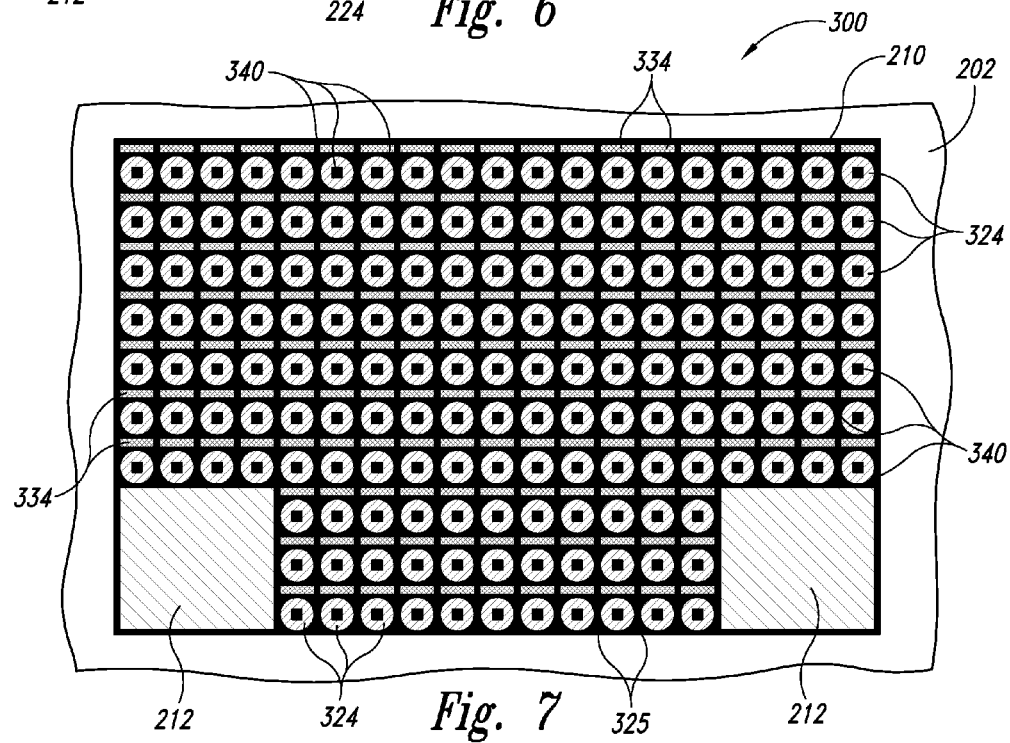
FIG. 7 is a partially schematic, top view of a portion of a microelectronic workpiece after selectively applying light conversion materials onto an LED in accordance with another embodiment of the technology.
Figure 8:
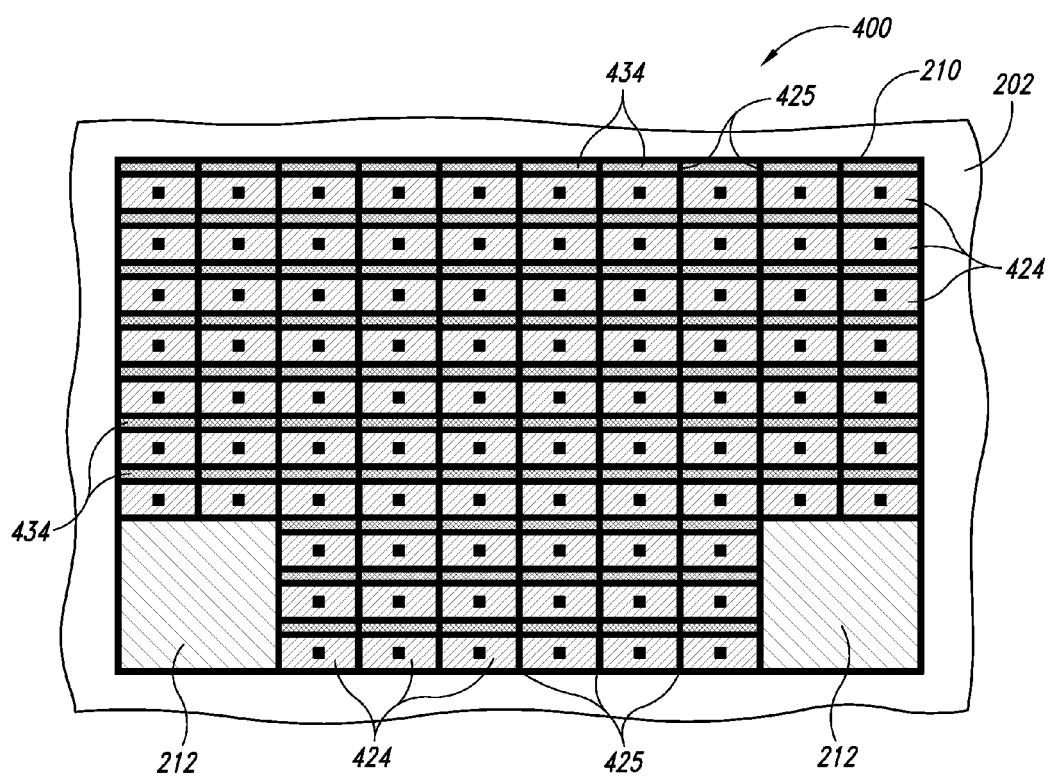
FIG. 8 is a partially schematic, top view of a portion of a microelectronic workpiece after selectively applying light conversion materials onto an LED in accordance with still another embodiment of the technology.

FIGS. 7 and 8 illustrate two additional embodiments of methods for selectively applying light conversion materials onto microelectronic workpieces as described above with respect to FIGS. 2A-6. In each of FIGS. 7 and 8, several of the features may be the same as those discussed above in connection with the workpiece 200 of FIGS. 2A-6. Accordingly, like reference numbers refer to like components in FIG. 2A-6 and FIGS. 7 and 8.

FIG. 7, for example, is a partially schematic, top plan view of a workpiece 300 having light conversion materials applied on the LED 210 in accordance with another embodiment of the technology. More specifically, the workpiece 300 differs from the workpiece 200 shown in FIGS. 2A-6 in that a first light conversion material 324 and a second light conversion material 334 have been selectively applied onto the LED 210 in a different pattern than the first and second light conversion materials 224 and 234 of FIG. 6. In this embodiment, for example, the first light conversion material 324 includes a plurality of generally concentric circles across the LED 210. Other shapes, e.g., triangular, hexagonal, etc., are also contemplated. The individual circular portions of the first light conversion material 324 are separated by channels or gaps 325. A portion of these channels or gaps 325 comprise uncoated regions 340 that allow blue light from the LED 210 to pass through.

FIG. 8 is a partially schematic, top plan view of a workpiece 400 having light conversion materials applied onto the LED 210 in accordance with still another embodiment of the technology. The workpiece 400 differs from the workpieces 200 and 300 described above with reference to FIGS. 2A-7 in that a first light conversion material 424 has been applied onto the LED 210 in a plurality of individual rectilinear portions across the LED 210. The individual rectilinear portions of the first light conversion material 424 are separated by channels or gaps 425. Individual portions of a second light conversion material 434 are applied onto the LED 210 in a pattern generally corresponding to the arrangement of the rectilinear portions of the first light conversion materials 424. In still other embodiments, portions of the first and/or second light conversion materials can be selectively applied onto the LED 210 in other shapes (e.g., polygonal) or suitable patterns.

From the foregoing, it will be appreciated that specific embodiments of the technology have been described herein for purposes of illustration, but that various modifications may be made without deviating from the spirit and scope of the technology. For example, structures and/or processes described in the context of particular embodiments may be combined or eliminated in other embodiments. In particular, the arrangement of the first and/or second light conversion materials described above with reference to particular embodiments can include one or more additional light conversion materials selectively applied onto selected LEDs across the wafer, or one or more of the light conversion materials described above can be omitted. Moreover, while advantages associated with certain embodiments of the technology have been described in the context of these embodiments, other embodiments may also exhibit such advantages, and not all embodiments need necessarily exhibit such advantages to fall within the scope of the technology. Accordingly, embodiments of the technology are not limited except as by the appended claims

I claim:

1. A microelectronic workpiece, comprising;
   a semiconductor substrate; and
   a plurality of light emitting diodes (LEDs) on the substrate, wherein the individual LEDs includes:
   a first converter material in a first predetermined pattern on the LED; and
   a second converter material in a second predetermind pattern on the LED, wherein the second pattern is different the the first pattern, and wherein at least a portion of the LED is accessible through the first and second patterns,
   wherein:
   a combined emission from the LED, the converter material, and the second converter material produces a light having desired spectral constituents,
   the first converter material is spaced apart from the second converter material by a gap on the individual LED, wherein at least a portion of the LED is accessible through the gap, and
   the gap between the first and second converter materials is selected to compensate for variation in emission wavelengths across the plurality of LEDs.

2. The microelectronic workpiece of claim 1 wherein:
   the individual LEDs on the substrate comprise an indium gallium nitride (InGaN) material between an N-type gallium nitride (GaN) material and a P-type GaN material;
   the first converter material comprises a yellow phosphor material; and
   the second converter material comprises a red phosphor material.

3. The microelectronic workpiece of claim 1 wherein:
   the first pattern comprises an array of first blocks across the LED and separated by first gaps; and
   the second pattern comprises an array of second blocks across the LED and separated by second gaps.

4. The microelectronic workpiece of claim 3 wherein:
   the first blocks include generally circular, rectilinear, and/or polygonal-shaped blocks; and
   the second blocks include generally circular, rectilinear, and/or polygonal-shaped blocks.

5. The microelectronic workpiece of claim 1 wherein at least one of the first predetermined pattern of the first converter material and the second predetermined pattern of the second converter material is selected to further compensate for variation in emission wavelengths across the plurality of LEDs.

6. The microelectronic workpiece of claim 1 wherein at least one of a composition, a concentration, and a quantity of the first converter material and/or the second converter material is selected to further compensate for variation in emission wavelengths across the plurality of LEDs.

7. The microelectronic workpiece of claim 1 wherein the combined emission from the individual LEDs at least approximates a white light.

8. A microelectronic device, comprising:
   a light emitting diode (LED);
   a first light conversion material covering a first portion of the LED; and
   a second light conversion material covering a second portion of the LED, wherein the second light conversion material is separated from the first light conversion material by a gap, and wherein the second light conversion material has a second pattern that is different than the first pattern,
   wherein during operation of the LED, at least a portion of a light emitted by the LED passes through the gap.

9. The microelectronic device of claim 8 wherein, during operation of the LED, a combined emission from the LED through the gap, the first light conversion material, and the second light conversion material produces a light having desired spectral constituents.

10. The microelectronic device of claim 8 wherein, during operation of the LED, a combined emission from the LED through the gap, the first light conversion material, and the second light conversion material at least approximates white light.

11. The microelectronic device of claim 8 wherein the first light conversion material comprises a first phosphor material and the second light conversion material comprises a second phosphor material.

12. The microelectronic device of claim 11 wherein the first phosphor material comprises a yellow phosphor material that includes Cerium (III)-doped Yttrium Aluminum Garnet (Ce:YAG), and wherein the second phosphor material comprises a red phosphor material that includes (Ce:YAG).

13. The microelectronic device of claim 8 wherein the LED provides blue light.

14. The microelectronic device of claim 8 wherein the LED comprises a third light conversion material having a third pattern that is different than the first and second patterns.

15. The microelectronic device of claim 8 wherein at least one of the first pattern of the first light conversion material and the second pattern of the second light conversion material is based, at least in part, on a measured emission characteristic of the LED.

16. The microelectronic device of claim 8 wherein at least one of a composition, a concentration, and a quantity of the first light conversion material and/or the second conversion material is based, at least in part, on a measured emission characteristic of the LED.

17. A light emitting diode (LED), comprising:
    a stack of semiconductor materials configured to emit light from a surface of the stack of semiconductor materials;
    a first light conversion material partially covering the surface of the stack of semiconductor materials; and
    a second light conversion material partially covering the surface of the stack of semiconductor materials and separated from the first light conversion material by a gap,
    wherein a portion of the surface of the stack of semiconductor materials is accessible through the gap, and
    wherein a portion of the light emitted from the semiconductor material is transmitted through the gap.

18. The LED of claim 17 wherein the first light conversion material has a first selected pattern and the second light conversion material has a second selected pattern, wherein the first and second selected patterns provide desired spectral constituents to portions of the light emitted from the semiconductor materials.

19. The LED of claim 17 wherein the first light conversion material has a first composition and the second light conversion material has a second composition, wherein the first and second selected compositions provide desired spectral constituents to portions of the light emitted from the semiconductor materials.

20. A microelectronic device, comprising a light emitting diode (LED), a first patterned converter material on the LED, and a second patterned converter material on the LED and separated from the first patterned converter material, wherein:

the first patterned converter material produces a first emission;

the second patterned converter produces a second emission;

the LED produces a third emission;

the LED transmits a portion of the third emission between the first and second converter materials without transmitting the portion of the third emission through any intervening light conversion materials disposed on the LED; and the portion of the third emission combines with the first and second emissions to produce light having spectral constituents.

21. The microelectronic device of claim 20 wherein:

the portion of the third emission includes a first portion of the third emission;

the LED transmits a second portion of the third emission through the first patterned converter material to produce the first emission; and the LED transmits a third portion of the third emission through the second patterned converter material to produce the second emission.

\* \* \* \* \*

UNITED STATES PATENT AND TRADEMARK OFFICE
CERTIFICATE OF CORRECTION

| | | |
|---|---|---|
| PATENT NO. | : 8,633,500 B2 | Page 1 of 1 |
| APPLICATION NO. | : 13/607316 | |
| DATED | : January 21, 2014 | |
| INVENTOR(S) | : Charles M. Watkins | |

It is certified that error appears in the above-identified patent and that said Letters Patent is hereby corrected as shown below:

In the Claims

In column 7, line 8, in Claim 1, delete "predetermind" and insert -- predetermined --, therefor.

In column 7, line 10, in Claim 1, delete "the the" and insert -- than the --, therefor.

In column 7, line 14, in Claim 1, after "the" insert -- first --.

Signed and Sealed this
Twenty-fifth Day of March, 2014

Michelle K. Lee
*Deputy Director of the United States Patent and Trademark Office*